United States Patent [19]
Burward-Hoy

[11] Patent Number: 5,815,921
[45] Date of Patent: Oct. 6, 1998

[54] ELECTRONIC PACKAGE COOLING SYSTEM AND HEAT SINK WITH HEAT TRANSFER ASSEMBLY

[75] Inventor: Trevor Burward-Hoy, Cupertino, Calif.

[73] Assignee: Sun Microsystems, Inc., Mountain View, Calif.

[21] Appl. No.: 850,945

[22] Filed: May 5, 1997

Related U.S. Application Data

[60] Continuation of Ser. No. 470,620, Jun. 6, 1995, abandoned, which is a division of Ser. No. 186,967, Jan. 26, 1994, Pat. No. 5,461,766.

[51] Int. Cl.$^6$ ................................................. B23P 15/00
[52] U.S. Cl. ................ 29/890.046; 29/447; 29/890.036; 257/713; 257/722; 361/687; 361/697; 361/718; 165/80.3
[58] Field of Search ...................... 29/447, 448, 890.036, 29/890.046; 257/713, 717, 718, 720, 722; 361/103, 687, 695, 697, 704, 707, 710, 709, 717, 718, 722; 165/80.2, 80.3, 185

[56] References Cited

U.S. PATENT DOCUMENTS

| | | | |
|---|---|---|---|
| 3,481,393 | 12/1969 | Chu | 165/80 |
| 3,868,754 | 3/1975 | Kawano | 29/157.3 A |
| 4,035,007 | 7/1977 | Harrison et al. | 285/381 |
| 4,109,707 | 8/1978 | Wilson et al. | 165/80.4 |
| 4,253,515 | 3/1981 | Swiatosz | 165/61 |
| 4,377,894 | 3/1983 | Yoshida | 29/421 R |
| 4,379,009 | 4/1983 | Shibata et al. | 156/86 |
| 4,418,453 | 12/1983 | Brown et al. | 29/33 M |
| 4,485,429 | 11/1984 | Mittal | 165/104.33 |
| 4,555,945 | 12/1985 | Hanson | 73/517 B |
| 4,620,215 | 10/1986 | Lee | 257/722 |
| 4,866,570 | 9/1989 | Porter | 165/104.33 |
| 4,890,195 | 12/1989 | Heckaman et al. | 361/386 |
| 5,032,897 | 7/1991 | Mansuria et al. | 357/81 |
| 5,056,209 | 10/1991 | Ohashi et al. | 29/517 |
| 5,088,005 | 2/1992 | Ciaccio | 165/104.33 |
| 5,126,919 | 6/1992 | Yamamoto et al. | 361/385 |
| 5,144,531 | 9/1992 | Go et al. | 361/382 |
| 5,183,104 | 2/1993 | Novotny | 165/104.33 |
| 5,188,286 | 2/1993 | Pence, IV | 236/1 F |
| 5,191,511 | 3/1993 | Sawaya | 257/713 |
| 5,200,810 | 4/1993 | Wojnarowski et al. | 361/398 |
| 5,256,902 | 10/1993 | Culver | 165/80.3 |
| 5,263,536 | 11/1993 | Hulburd et al. | 165/104.33 |
| 5,270,572 | 12/1993 | Nakajima et al. | 257/714 |
| 5,313,099 | 5/1994 | Tata et al. | 257/718 |
| 5,316,075 | 5/1994 | Quon et al. | 165/104.33 |
| 5,375,650 | 12/1994 | Mizuno | 156/104.33 |
| 5,375,652 | 12/1994 | Matsunaga et al. | 257/718 |
| 5,397,919 | 3/1995 | Tata et al. | 257/718 |
| 5,430,322 | 7/1995 | Koyanagi et al. | 257/930 |
| 5,434,744 | 7/1995 | Fritz et al. | 361/704 |
| 5,448,107 | 9/1995 | Osada et al. | 257/722 |
| 5,535,816 | 7/1996 | Ishidt | 165/185 |

FOREIGN PATENT DOCUMENTS

| | | | |
|---|---|---|---|
| 1295449 | 11/1989 | Japan | 257/930 |
| 0547996 | 2/1993 | Japan . | |
| 1611679 | 7/1990 | U.S.S.R. | 29/890.046 |

OTHER PUBLICATIONS

Johnson, *Device Cooling*, IBM Technical Disclosure Bulletin, vol. 20, No. 10, Mar. 1978, pp. 3919–3920.

*Primary Examiner*—Larry I. Schwartz
*Assistant Examiner*—Marc W. Butler
*Attorney, Agent, or Firm*—Blakely Sokoloff Taylor & Zafman

[57] ABSTRACT

A method for minimizing thermal overhead in an integrated circuit package is described. A heat sink having a base is integrally formed into the package. The base is connected to the die, and a portion of the heat sink projects from the package, forming a post. A heat transfer assembly having a shaft with an aperture is heated until the aperture expands sufficiently to allow the heat transfer assembly to be fitted on the post with a minimum of force. Upon cooling, a tight joint is formed between the heat sink and the heat transfer assembly.

6 Claims, 3 Drawing Sheets

FIG_1
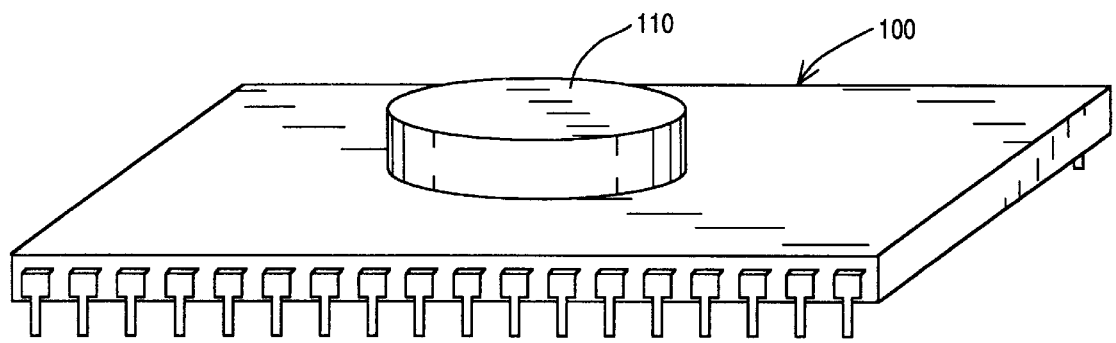
FIG_2
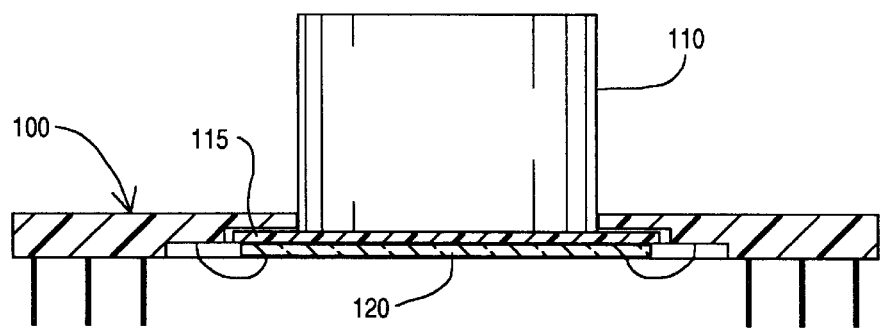
FIG_3
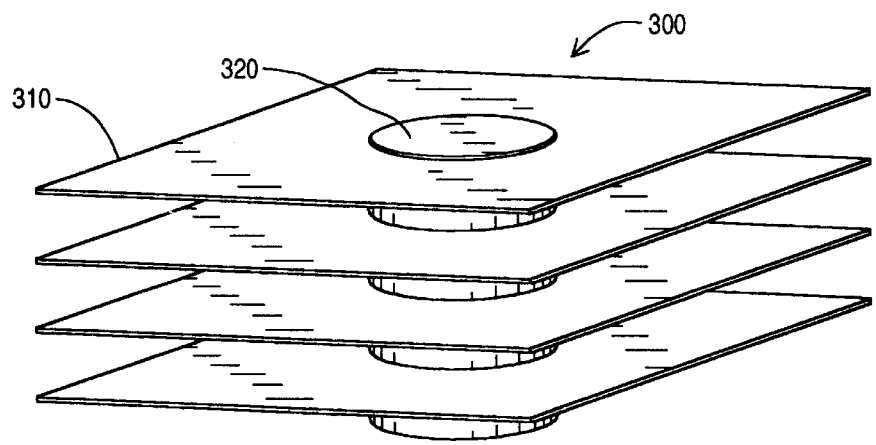

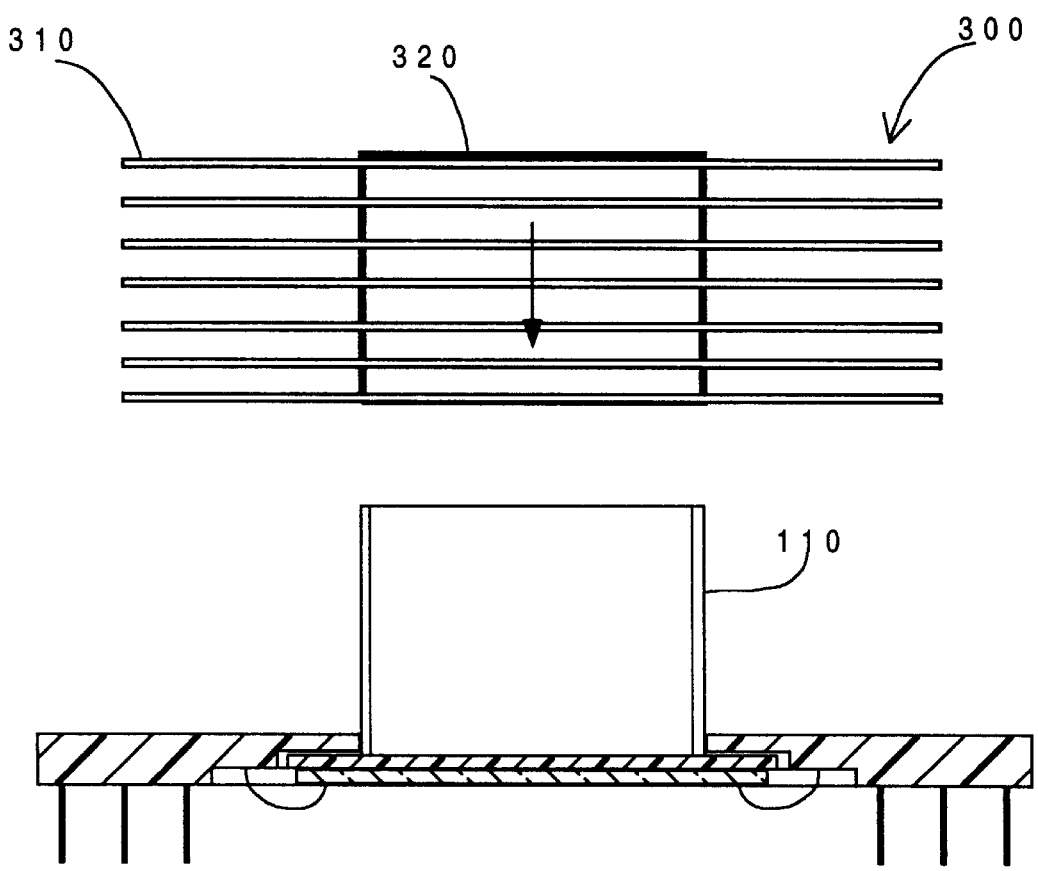
FIG_4

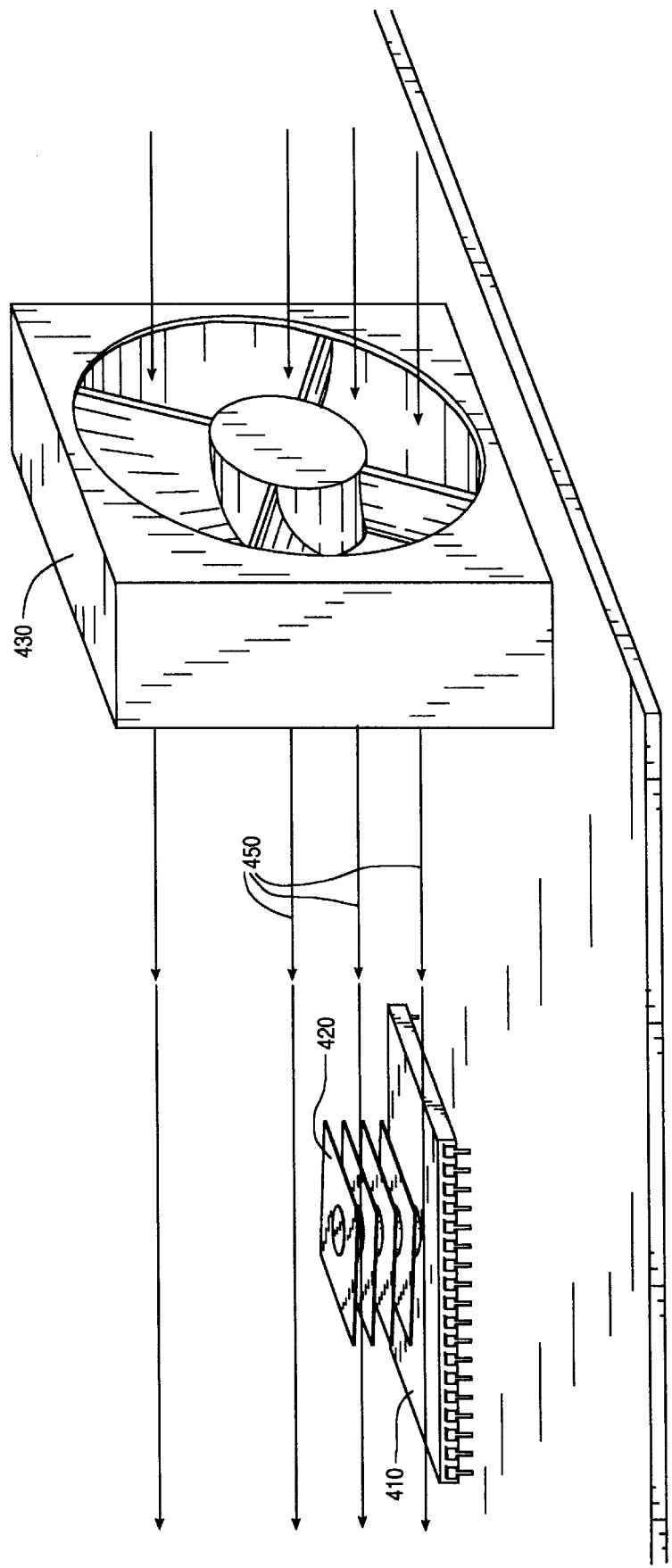
FIG_5

ELECTRONIC PACKAGE COOLING SYSTEM AND HEAT SINK WITH HEAT TRANSFER ASSEMBLY

This is a continuation of application Ser. No. 08/470,620 filed Jun. 6, 1995 abandoned Jul. 7, 1997 which is a divisional of application Ser. No. 08/186,967 filed Jan. 26, 1994 now U.S. Pat. No. 5,461,766.

BACKGROUND OF THE INVENTION

1. Field of the Invention

The methods and apparatus of the present invention relate generally to the field of heat dissipation for an integrated circuit (IC). More particularly, the present invention presents a method for providing high efficiency thermal interfaces in an IC package.

2. Art Background

Integrated circuits consume power during operation, generating heat. This heat must be carried away from the IC at a sufficient rate such that the temperature of the die remains within operating parameters. Both the operating temperature of the die and the number of watts dissipated are typically specified for each IC. For example, a typical die operating temperature is 95° C. Failure to cool the IC properly can lead to the IC failing during operation.

A typical prior art solution uses a heat sink that is attached to the IC package in conjunction with an air-moving cooling system. A fan blows air onto the heat sink, transferring heat from the heat sink to the air. The fan causes the heated air to be carried away from the heat sink. The cooling requirements of the cooling system may be expressed by the following equation:

$$(1) \quad Q = \Delta T \cdot C_p \cdot M$$

Here, Q is the number of watts to be dissipated; $\Delta T$ is the difference in temperature between the heat sink ($T_{sink}$) and the ambient air ($T_{air}$); $C_p$ is the thermal conductivity of air and is a constant; and M is the mass-flow of the air to be moved by the fan of the cooling system.

Typically, the interface between the heat sink and the package is of a low thermal efficiency. For example, a heat sink can be glued onto the outside of the package. The glue typically is of a higher thermal impedance than the heat sink. Further, there is some thermal impedance between the die and the package. The thermal impedances combine, preventing some heat from reaching the heat sink. The trapped heat or thermal overhead is a function of the number of watts dissipated by the IC and the thermal impedances between the die and the heat sink. This thermal overhead appears as a temperature gradient between the die and the heat sink. Thus, $T_{sink}$ is actually the temperature of the die ($T_{die}$) minus the thermal overhead ($T_{over}$). Every low efficiency thermal interface in the package/heat sink system adds to the thermal overhead.

In a low power device, the thermal overhead is not critical, but thermal overhead is of great concern in modern high-power ICs. It can be seen that if the thermal impedances remain the same for the high-power devices, $T_{over}$ increases. This is because, for design purposes, $T_{die}$ is a constant equal to the operating temperature of the IC (e.g. 95° C.). Thus, $T_{sink}$ decreases, and the fan must provide a greater mass-flow of air in order to cool the IC. Practically speaking, the fan size most probably will be increased for very high-power devices, resulting in a corresponding increase in the noise signature of the computer system and greater cost. Such a solution is not desirable. Accordingly, the thermal overhead should be minimized to avoid the need for larger fans.

Therefore, as will be described, the method and apparatus of the present invention provide an improved integrated circuit package having minimal thermal overhead. More specifically, a heat pipe is integrally formed in the integrated circuit package, and a heat transfer assembly is fitted over the heat pipe using minimal pressure. The thermal interfaces thus provided are thermally efficient.

SUMMARY OF THE INVENTION

An apparatus for minimizing thermal overhead in an integrated circuit package is disclosed. The integrated circuit package contains a die that generates heat. A heat sink having a base is provided. The heat sink may be a heat pipe or a solid piece of thermally conductive material. The base of the heat sink is connected to the die such that a projecting portion of the heat sink projects from the integrated circuit package. The projecting portion of the heat sink forms a post upon which a heat transfer assembly can be fitted.

A heat transfer assembly is provided. The heat transfer assembly can be a fin assembly and includes a shaft having an aperture. The heat transfer assembly is heated in order to expand the aperture so that it may be fitted on the post while applying minimum to no pressure. The aperture is fitted on the post, and the heat transfer assembly is allowed to cool. The compressive forces of the cooling material of the heat transfer assembly create a tight joint between the heat sink and the heat transfer assembly. Thus, themal overhead is reduced.

BRIEF DESCRIPTION OF THE DRAWINGS

The objects, features, and advantages of the method and apparatus of the present invention will be apparent from the following detailed description of the invention in which:

FIG. 1 is a perspective view of an illustrative embodiment of the IC package design.

FIG. 2 is a cross-sectional view of the illustrative embodiment.

FIG. 3 is a perspective view of a heat transfer assembly.

FIG. 4 illustrates the manner in which the heat transfer assembly is fit over the heat pipe of the IC package design.

FIG. 5 is perspective view of the IC package with the heat transfer assembly attached in an computer illustrative system..

DETAILED DESCRIPTION OF THE INVENTION

An IC package has a heat sink as an integral part of the package. The heat sink projects from the surface of the package forming a post. After the package is assembled, a heat transfer element having an aperture is mounted on the post by first heating the heat transfer assembly until the aperture expands sufficiently to slide easily over the post. Compressive forces upon cooling ensures an excellent thermal joint between the heat spreader and the heat transfer assembly, reducing the thermal overhead for the IC. Although the present invention is described with reference to specific figures, it will be appreciated by one of ordinary skill in the art that such details are disclosed simply to provide a more thorough understanding of the present invention. It will therefore be apparent to one skilled in the art that the present invention may be practiced without the specific details.

FIG. 1 is a perspective view of an exemplary IC package 100 having a heat sink 110 as an integral part of the package. Heat sink 110 may be manufactured of a thermally conducting material such as copper. The heat sink 110 can be a heat spreader or a heat pipe and is preferably a cylinder having its top and side surfaces ground to a smooth even finish. Finishing the surfaces of the cylinder helps to ensure that the heat transfer assembly will make good thermal contact with the heat sink 110. The height of the heat sink 110 is preferably such that typical manufacturing robotics need not be redesigned to handle the package 100. It will be understood by one having ordinary skill in the art that the shape of the heat sink is not limited to a cylinder. For example, the heat sink can be configured as a multiple pin assembly, rather than as a single cylinder. To ensure good thermal contact for all heat sink shapes, the shape of the heat transfer assembly should be altered to account for changes in the shape and configuration of the heat sink.

FIG. 2 is a cross-sectional view of the IC package of FIG. 1. It can be seen that the heat sink 110 is thermally connected to the heat sink base 115 which is thermally connected to die 120. Because the heat sink is an integral part of the package, that portion of the thermal overhead associated with attaching the heat sink to the package 100 is minimized. Assembly of the package can be done according to methods known in the art.

FIG. 3 is an exemplary heat transfer assembly. In the illustrative embodiment, the heat transfer assembly is a fin assembly 300 having a plurality of fins 310 and a shaft 320. The shaft 320 has an aperture for receiving the post formed by the heat sink (not shown). At room temperature, the diameter of the aperture of the shaft 320 is preferably less than or equal to the diameter of the heat sink shown in FIGS. 1 and 2. Controlling the size of the aperture of the heat transfer assembly relative to the heat sink is important to achieving good thermal contact. The fin assembly 300 is preferably manufactured of copper or some other material of high thermal conductance. In order to fit the fin assembly 300 on the heat sink, the fin assembly 300 is heated to approximately 400° C. which causes the diameter of the aperture to expand by approximately 0.005 inches. This allows the heated fin assembly 300 to be dropped onto the heat sink, which is at room temperature, minimizing the amount of pressure applied to the package. The ease of fitting the heat transfer assembly on the heat sink is important because the heat sink is in direct contact with the die. Excess pressure placed on the heat sink can result in the die, the bond wires, or the package itself being damaged.

As the fin assembly 300 cools, the diameter of the aperture shrinks. A tight thermal joint is ensured by the compressive forces. Because the joint is a tight connection between two materials of high thermal conductance, the thermal overhead is reduced. This method is simple to implement and may easily be performed by existing pick-and-place systems. For example, the heat transfer assembly may be heated in a temperature controlled oven. The package having the integral heat sink is held in a fixture, and the heated heat transfer assembly is dropped onto the package such that it fits over the shaft of the heat sink. The entire assembly is then cooled to room temperature with a blast of cool air. Immediate cooling avoids heating the package and its die attach above its melting or degradation value. FIG. 4 illustrates how the heat transfer assembly 300 can be fitted over the heat pipe 110.

FIG. 5 is a perspective view of a cooling system for a computer system that implements an illustrative integrated circuit cooling system. The cooling system 400 includes the integrated circuit package 410 with a fin assembly 420 attached. During normal operation, the die in the integrated circuit package 410 generates heat which is transferred to the heat sink. The fin assembly 420 is tightly coupled to the heat sink, and heat is transferred to the fin assembly 420. The fan 430 blows cool air over the integrated circuit package 410 and the fin assembly 420. Heat is transferred from the fin assembly 420 to the air, heating it. The heated air is carried away from the integrated circuit package 410 and the fin assembly 420, as indicated by air flow lines 450.

Thus, method and apparatus of the present invention that provide an improved integrated circuit package having minimal thermal overhead have been described. While the method and apparatus of the present invention have been disclosed in terms of the presently preferred and alternative embodiments, those skilled in the art will recognize that the present invention may be practiced with modification and alteration without departing from the spirit and scope of the invention. The specifications and drawings are, accordingly, to be regarded as illustrative, not restrictive.

What is claimed is:

1. An integrated circuit package cooling system comprising:

a package, comprising:
a die having an integrated circuit formed thereon, and
a heat sink having a first end and a second end, a heat sink base defining the first end and being directly connected to the dies and the second end projecting from the package to form a post; and a heat transfer assembly compressively attached to the post, wherein the heat transfer assembly is heated in order to be fitted on the post with a minimum pressure and subsequently cooled to form a tight joint with the post for all operating temperatures of the integrated circuit.

2. The cooling system of claim 1, wherein the heat transfer is a fin assembly.

3. The integrated circuit package cooling system of claim 1, wherein the heat sink is a heat pipe.

4. In a computer system, a cooling system comprising:

a fan that blows air;

a package, comprising:
a die having an integrated circuit formed thereon, and
a heat sink having a first end and a second end, a heat sink base defining the first end and being directly connected, to the die and the second end projecting from the package to form a post; and a heat transfer assembly compressively attached to the post, wherein the heat transfer assembly is heated in order to be fitted on the post with a minimum pressure and subsequently cooled to form a tight joint with the post for all operating temperatures of the integrated circuit.

5. The cooling system of claim 4, wherein the heat sink is a heat pipe.

6. The cooling system of claim 4, wherein the heat transfer assembly is a fin assembly.

* * * * *